United States Patent [19]

Ashmore, Jr.

[11] Patent Number: 5,132,935
[45] Date of Patent: Jul. 21, 1992

[54] ERASURE OF EEPROM MEMORY ARRAYS TO PREVENT OVER-ERASED CELLS

[76] Inventor: Benjamin H. Ashmore, Jr., 7922 Dawnridge, Houston, Tex. 77071

[21] Appl. No.: 509,532

[22] Filed: Apr. 16, 1990

[51] Int. Cl.⁵ .............................................. G11C 7/00
[52] U.S. Cl. .................................... 365/185; 365/218
[58] Field of Search ...................... 365/184, 185, 218; 357/23.5

[56] References Cited

U.S. PATENT DOCUMENTS 4,888,738  12/1989  Wong et al. ......................... 365/218

*Primary Examiner*—Joseph A. Popek
*Attorney, Agent, or Firm*—Theodore D. Lindgren; Lawrence J. Bassuk; Richard L. Donaldson

[57] ABSTRACT

The device and process of this invention provide for eliminating reading errors caused by over-erased cells by subsequently applying alternating erasing and programming pulses to the cells of an EEPROM array, starting with relatively high-energy-level erasing and programming voltages, decreasing the energy-level of each of the alternating erasing and programming voltages. The initial, relatively high-energy-level pulses should have sufficient energy to cause all of the cells to be programmed and to cause all of the cells to be over-erased. The energy-levels are decreased until electron transfer between floating gate and a source or drain region ceases. As the energy-levels are decreased, the threshold voltage range of the memory cells is compacted. The final threshold voltages are distributed within a preselected narrow range of positive values that are less than a predetermined wordline select voltage.

20 Claims, 2 Drawing Sheets

ERASURE OF EEPROM MEMORY ARRAYS TO PREVENT OVER-ERASED CELLS

BACKGROUND OF THE INVENTION

This invention relates to nonvolatile memory arrays, such as electrically-erasable, electrically-programmable, read-only-memories (EEPROMs) of the single-transistor type and to eliminating errors that occur in reading EEPROM cell arrays having over-erased cells.

In particular, the invention relates to avoiding or eliminating read errors resulting from over-erasing the floating-gate conductors of nonvolatile memory arrays. An EEPROM cell is over-erased when an excessive number of electrons is removed from its floating gate during an erasing operation. The source-drain path of an over-erased EEPROM cell is conductive with the control gate and the source or drain at the same electric potential.

EEPROM arrays include floating-gate memory cells arranged in rows and columns. The floating gate of a programmed memory cell is charged with electrons, and the electrons in turn render the source-drain path under the charged floating gate nonconductive when a chosen wordline select voltage is applied to the control gate. The nonconductive state is read as a "zero" bit. The floating gate of a non-programmed cell is positively charged, is neutrally charged, or is slightly negatively charged, such that the source-drain path under the non-programmed floating gate is conductive when the same chosen wordline select voltage is applied to the control gate. The conductive state is read as a "one" bit.

Each column and row of an EEPROM array may contain thousands of cells. The sources of each cell in a column are connected to a bitline (source-column line). The drains of each cell in a column are connected to a separate bitline (drain-column line). The control gates of each cell in a row are connected to a wordline. Prior to first programming, or perhaps after erasure by ultraviolet light, the source-drain paths of the cells begin to conduct at a uniform control-gate threshold voltage $V_t$ because the floating gates are neutrally charged (having neither an excess of electrons nor a deficiency of electrons). The initial uniform threshold voltage $V_t$ may be, for example, $+2.5$ volts between control gate and source. Adjustment of the initial uniform threshold voltage $V_t$ may be made by altering the doping the channel regions of the cells during manufacture.

After programming, the source-drain paths of the programmed cells have control-gate threshold voltage $V_t$ distributed over a range between $+6$ volts to $+9$ volts, for example. The distribution of threshold voltages $V_t$ among individual cells is caused by processing variations, including variations in the tunnel oxide thicknesses, the areas of tunnelling regions and in the coupling ratios of the control-gate voltages to the floating gates, as well as variations in the programming voltages applied to individual cells.

After electrical erasure of the cells, the threshold voltages $V_t$ of the erased cells may, for example, be distributed over a range from perhaps $+0.5$ to $+2.5$ volts with the majority of the cells having erased threshold voltages $V_t$ near $+1.5$ volts, the range depending on the localized variations in the tunnel oxide thickness, the areas of tunnelling regions, the capacitive coupling ratios between wordlines and floating gates, and the strengths of the erasing pulses. Using a lower-strength erasing pulses, the range may be from perhaps $+1.5$ to $+3.5$ volts with the majority of the cells having erased threshold voltages $V_t$ near 2.5 volts. With higher-strength erasing pulses applied, the distribution may range from perhaps $-0.5$ to $+1.5$ volts with the majority of cells having erased threshold voltages $V_t$ near $+0.5$ volt. Cells with erased threshold voltages $V_t$ less than that set during the manufacturing process have deficiencies of electrons (or have net positive charges) on the floating gates. The excess of positive charges on the floating gates causes the channel regions under such gates to be enhanced with electrons.

In general, the extent of channel doping, the programming pulse strength, the erasing pulse strength and other factors are chosen such that the source-drain path of a cell will either be conductive or non-conductive when applying a chosen wordline select voltage to the control gate. The select voltage must have a value somewhere between the highest erased-threshold-voltage value of erased cells and the lowest programmed-threshold-voltage value of the programmed cells. In many memory arrays, the channel doping, programming/erasing voltages and other factors are chosen such that the wordline select voltage is equal to the available chip supply voltage Vcc, which may be $+5$ volts. With $+5$ volt applied to the control gate, the source-drain paths of all of the properly erased cells are conductive only if those cells have threshold voltages $V_t$ below the $+5$ volt select voltage. Similarly, the source-drain paths of all of the properly programmed cells are non-conductive only if those cells have threshold voltages $V_t$ greater than the $+5$ volt select voltage. To guarantee that the correct state of a cell is sensed with a reasonable speed, even with a noisy chip supply voltage Vcc and with other typical fluctuations in drain bitline voltage, all of the threshold voltages $V_t$ of erased cells should be considerably less than $+5$ volts, perhaps less than $+3.5$ volts, and all of the threshold voltages $V_t$ of programmed cells should be considerably greater than $+5$ volts, perhaps greater than $+6.0$ volts.

One of the problems associated with EEPROMs of the type without split gates is the difficulty of reading memory arrays after some of the cells have been over-erased, becoming depletion-mode devices. Because the channel regions of the over-erased cells are in connected in parallel with all of the source-drain paths of other cells in a column, inaccuracies during reading operation may occur where the stored data in those columns is short-circuited by the over-erased cells. At least some of the over-erased cells may be conductive because the excessive positive charge on the floating gates causes the channel regions to invert from P-type to N-type.

The problems of over-erasure may be avoided by constructing cells with pass gates, or split gates, in which the channel between source and drain comprises two series sections, one section having the control gate separated from the channel region by the gate dielectric, the second region having the floating gate separated from the channel region by the gate dielectric. However, such memory cells require more area on a silicon chip than do cells without split gates.

The problem of over-erasure may also be minimized by performing multiple erasing operations, each operation increasing the erasing energy applied to the floating gate. Between each operation, the threshold voltages $V_t$ of all of the cells may be checked to see that a given maximum threshold voltage $V_t$ is not exceeded. However, that procedure does not provide correction for any cells that may be over-erased.

Alternatively, a similar procedure may be used to check between increased-energy erasing pulses to determine that the minimum erased threshold voltage Vt does not become less than some value greater than zero. However, this does not always guarantee that the highest erased threshold voltage Vt is low enough and, therefore, some of the cells may remain programmed. The highest erased threshold voltage Vt will determine the speed at which the memory will operate.

The circuit and method of U.S. patent application Ser. No. 07/367,597, filed Jun. 19, 1989, and also assigned to Texas Instruments Incorporated, relate to normal erasure of the cells of a memory array followed by application of relatively low-energy pre-conditioning pulses to the cells prior to re-programming the array. The low-energy pulses may tend to program and/or erase the cells, depending on the which is needed to distribute the threshold voltages between 0 volts and the select wordline voltage. U.S. Patent Application Ser. No. (07/509,432, filed Apr. 16, 1990 and also assigned to Texas Instruments Incorporated, relates to erasure of the cells of a memory array through alternate application of relatively high-energy erasing pulses that over-erase, followed by application of programming pulses of sufficient energy level to establish threshold voltages Vt between 0 volts and the wordline select voltage. Both methods may require experimentation or testing to determine the proper energy-levels of the applied pulses.

In the alternative, the negative-voltage method of U.S. patent application Ser. No. 07/437,553, filed Nov. 17, 1989 and also assigned to Texas Instruments Incorporated may be used to eliminate the adverse effects of over-erasure of memory cells. However, use of a negative voltage applied to wordlines requires special driver circuitry.

As yet another alternative for eliminating over-erasure errors, the channel regions of the EEPROM cells may have increased doping and the read voltages may be increased as described in U.S. patent application Ser. No. 07/437,553, filed Nov. 16, 1989 and also assigned to Texas Instruments Incorporated.

There is a need for a circuit and procedure that permit an EEPROM array to be read without the need for special driver circuitry, while at the same time permitting minimum-size memory cells without split gates. The circuit and procedure should eliminate errors caused by cells with excessively high or low threshold voltages Vt caused by conventional erasing methods, but without the necessity for experimentation and testing to determine the proper values of erasing and programming voltages for application during the erasing process.

SUMMARY OF THE INVENTION

The circuit and process of this invention provide for eliminating reading errors caused by over-erased cells by subsequently applying alternating erasing and programming voltages to the cells of an EEPROM array, starting with relatively high-energy-level erasing and programming pulses, then decreasing the energy-level of each of the alternating erasing and programming voltages. The initial, relatively high-energy-level pulses should have sufficient energy to cause all of the cells to be programmed and, in general, should have sufficient energy to cause all of the cells to be over-erased. The pulse energy-levels may be decreased until electron transfer between floating gate and a source-column line or a drain-column line ceases. As the pulse energy-levels are decreased, the threshold voltage Vt spread among the memory cells is compacted. The final threshold voltages Vt are distributed within a narrow range of values around the manufactured threshold voltage Vt or around another preselected value of threshold voltage Vt.

The circuit and process of this invention do not require that the threshold voltages Vt of the cells be monitored during the erase sequence of erase/program operations. When used with memory cells having tunnel windows for charging and discharging the floating gates, the programming and erasing voltages may be chosen to arrive at acceptable threshold voltages Vt for all of the memory cells, without experimentation to determine those acceptable threshold voltages Vt.

BRIEF DESCRIPTION OF THE DRAWINGS

The novel features of this invention are set forth in the appended claims. The invention, its features, and its advantages are described below in conjunction with the following drawings

DETAILED DESCRIPTION OF THE SPECIFIC EMBODIMENT

Figure 1:
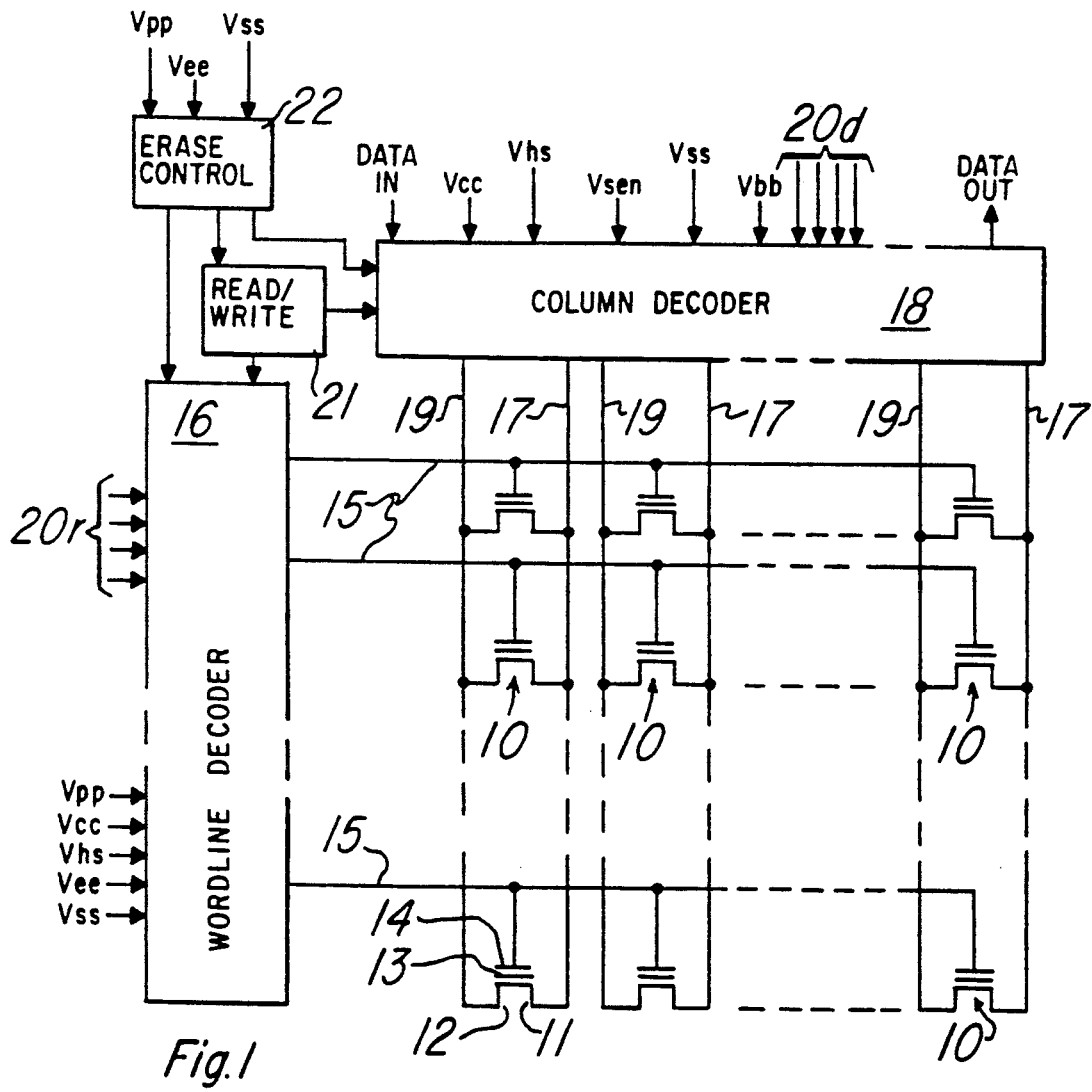
FIG. 1 is a representation of an array of memory cells and associated circuitry according to this invention.

Referring to FIG. 1, an example array of memory cells, which is an integral part of a memory chip, is shown for the purpose of illustrating use of the circuit of this invention. Each cell is a floating-gate transistor 10 having a source 11, a drain 12, a floating gate 13 and a control gate 14. A control terminal of each of the control gates 14 in a row of cells 10 is connected to a wordline 15, and each of the wordlines 15 is connected to a wordline decoder 16. A source terminal of each of the sources 11 in a column of cells 10 is connected to a source-column line 17, and each of the source-column lines 17 is connected to a column decoder 18. A drain terminal of each of the drains 12 in a column of cells 10 is connected to a drain-column line 19, and each of the drain-column lines 19 is connected to the column decoder 18.

In a write or program mode, the wordline decoder 16 may function, in response to wordline address signals on lines 20r and to a signal from read/write control circuit 21, to place a preselected first programming voltage Vpp (approx. +16 to +18 volts) on a selected wordline 15, including a selected control-gate conductor 14. Column decoder 18, in response to signals on lines 20d and to a signal from read/write control circuit 21, may function to place a preselected second programming voltage (reference potential Vss or ground, or a non-positive voltage) on selected source-column line 17, which includes a selected source region 11. The preselected second programming voltage Vss must differ sufficiently from the first preselected programming voltage Vpp that excess electrons will migrate, perhaps by Fowler-Nordheim tunnelling, to the selected floating-gate conductor 13 and, as a result, program that selected floating-gate conductor 13. Column decoder 18 may optionally, in response to signals on lines 20d and to a signal from read/write control 21, place a third preselected voltage Vhs (approx. +7 volts above Vss) on deselected source-column lines 17, including deselected source regions 11 within the array, to prevent a disturb of programmed floating-gate conductors associated with the deselected source regions 11. The wordline decoder 16 may optionally, in response to wordline address signals on lines 20r and to a signal from read/write control 21, place a fourth preselected voltage, which may also be Vhs (approx. +7 volts), on deselected wordlines 15, including deselected control-gate conductors 14. The fourth preselected voltage should be sufficiently close to the second programming voltage that the floating-gate conductors 13 associated with the deselected wordlines 15 will not be programmed as a result, but should be sufficiently high that stress will be reduced across any tunnelling windows of cells 10 in deselected wordlines 15, thereby avoiding de-programming of pre-programmed cells 10. The third and fourth preselected voltages should be placed on the respective electrodes before both first and second preselected programming voltages Vpp and Vss are both placed on their respective electrodes. The first programming voltage Vpp may be placed on the control-gate conductors 14 in a gradual manner so as to reduce voltage-induced stress on the selected cell 10. The drain-column lines 19 may be left floating. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

During a prior-art-type flash-erase mode, the column decoder 18 functions to apply a positive voltage Vcc (approx. +5 volts) to all the source-column lines 17. The column decoder 18 functions to leave all drain-column lines 19 floating. The wordline decoder 16 functions to apply a high negative voltage Vee (approx. −11 volts) to all the wordlines 15. The excess electrons are removed from the floating gates 13 of programmed cells 10. Selective erasing may be accomplished by changing Vee to perhaps −5 volts and by applying voltage Vcc to the selected wordline 15 while perhaps +10 volts is applied to the deselected wordlines 15 and the selected source-column line 17. Ground or reference voltage Vss is applied to the deselected source-column lines 17. Other applied voltages are the same as those of the flash-erase example.

In the read mode, the wordline decoder 16 functions, in response to wordline address signals on lines 20r and to a signal from read/write control circuit 21, to apply a preselected positive voltage Vcc (approx. +3 to +5 volts) to the selected wordline 15 (and the selected control gate 14), and to apply a low voltage (ground or Vss) to deselected wordlines 15. The column decoder 18 functions, in response to column address signals on lines 20d, to apply a preselected positive voltage Vsen (approx. +1 to +1.5 volts) to the selected drain-column line 19. The column decoder 18 also functions to connect all source-column lines 17 to ground (or Vss). The conductive or nonconductive state of the cell lo connected to the selected drain-column line 19 and the selected wordline 15 is detected by a sense amplifier (not shown) connected to the DATA OUT terminal.

As is well-known, the source 11 regions and the drain 12 regions of the memory cells 10 may be interchanged for the various modes of operation. For example, Fowler-Nordheim tunnelling for programming and/or erasing may take place between a drain 12 region and a floating-gate conductor 13, or between a source 11 region and a floating-gate conductor 13. Voltages applied to the source 11 and drain 12 regions in the read example above are interchangeable. Therefore, the terms "source" and "drain" as used herein are considered interchangeable for each mode of operation.

For convenience, a table of read, write and prior-art erase voltages is given in the TABLE I below:

TABLE I

|  | Read | Write | Erase Selected | Flash |
|---|---|---|---|---|
| Selected Wordline | 3–5 V | 16–18 V | −5 V | −11 V |
| Deselected Wordlines | 0 V | 7 V | 10 V | (None) |
| Selected Source Line | 0 V | 0 V | 10 V | 5 V |
| Deselected Source Lines | Float | 7 V | 0 V | (None) |
| Drain Lines | 1–1.5 V | Float | Float | Float |

The cells 10 of FIG. 1 are presumed to be of the type that does not include a split gate, or a pass gate. The cells 10 of FIG. 1 are shown connected with separate source-column lines 17 for each column of sources 11 and with separate drain-column lines 19 for each column of drains 12, although this invention applies equally to cells 10 that are arranged in columns having common bitlines 17 and/or 19.

The source-drain paths of each cell 10 in a column are connected in parallel. Because of the parallel connection, and conductive cell 10 is a column will short-circuit all of the other cells 10 in that column. In particular, if one of the cells 10 in a column is sufficiently over-erased, the channel region of that cell 10 will be inverted from P-type to N-type material by positive charges on floating gate 13, and the source-drain path of cell 10 will be conductive. A column of cells 10 that is short-circuited by one or more over-erased cells 10 is difficult, perhaps impossible, to read if the cell 10 is constructed without a pass gate.

Application of pulsed programming voltages or currents to selected cells 10 causes pulsed programming electric fields in the insulated region between the floating gate 13 and the substrate of the selected memory cells 10 of the EEPROM array, the electric fields adjacent at least an area of the floating gate 13 and directed away from that area of each of the floating gates 13. As illustrated by curve A of FIG. 2(a) the cells 10 of an array have, in general, a fairly uniform initial threshold voltage Vts prior to programming of those cells 10. The initial threshold voltage Vts is set during manufacture by doping the channel region of the cell 10 with an impurity of conductivity-type (P-type or N-type), usually opposite that used to dope the source 11 and drain 12 regions. The initial threshold voltage Vts in floating-gate-type memory cells 10 is usually in the range of one half of the wordline select voltage Vcc applied to the control gate 14 during read operations. The wordline select voltage Vcc is often the chip supply voltage. For example, initial threshold voltages Vts of available cells 10 may be from +1.5 to +3.5 volts where Vcc is 5 volts.

Figure 2A:
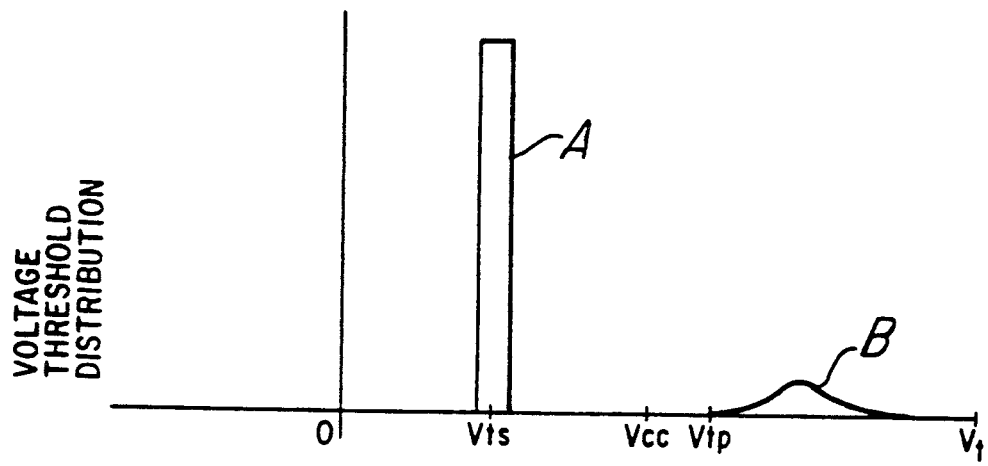
FIG. 2(a) illustrates an example distribution of threshold voltages of an array of memory cells after manufacture or after ultraviolet-type of erasure and before programming and illustrates an example distribution of threshold voltages after programming.

After application of pulsed programming voltages/currents, as illustrated by curve B of FIG. 2(a), selected cells 10 have distributed threshold voltages Vt above a minimum programmed-threshold voltage Vtp, the distribution being caused by random processing variations. The value of Vtp in may be, for example, one volta above wordline select voltage Vcc (one volt above the supply voltage). Some of the cells 10 may have localized thinner dielectrics, perhaps resulting from a process that is location-dependent. Other cells 10 may have smaller-area channel regions, perhaps because of variations in masking size. The programmed threshold voltage Vt distribution B is illustrated as a Gaussian or bell-shaped distribution in FIG. 2(a), although actual distributions have a variety of shapes depending on particular types of processing variations.

Figure 2B:
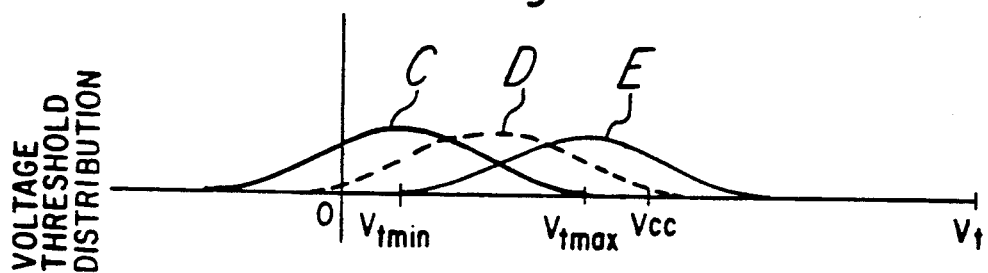
FIG. 2(b) illustrates example distributions of threshold voltages of the array of memory cells after erasure.

Curve C of FIG. 2(b) illustrates an erased threshold voltage Vt distribution in which, according to known procedures, the cells 10 are tested between application of pulsed erasing voltages/currents of different energy levels until all of the cells 10 have threshold voltages Vt below a prescribed maximum threshold voltage Vtmax, which is less than the select voltage Vcc. As illustrated by the negative threshold voltages Vt of Curve C, a disadvantage of the known method is that some of the cells 10 may be over-erased in order to achieve the maximum threshold voltage limitation, Vtmax. Those over-erased cells 10 will short-circuit the connected source-column and drain-column lines 17 and 19, causing erroneous reading of the programmed cells 10 sharing the columns in which over-erased cells 10 are located.

Curve D of FIG. 1(b) illustrates a type of erased threshold voltage Vt distribution in which cells 10 are tested between application of pulsed erasing voltages/currents of different energy levels until all of the cells 10 have threshold voltages Vt above a prescribed minimum threshold voltage Vtmin. As illustrated by Curve D, a disadvantage of this method is that some of the cells 10 may have threshold voltages Vt that exceed the select voltage Vcc. Those cells 10 will be read as programmed cells.

Curve E of FIG. 2(b) illustrates an extreme type of erased threshold voltage Vt distribution in which some of the cells 10 are over-erased and in which some of the cells 10 remain programmed.

Figure 2C:
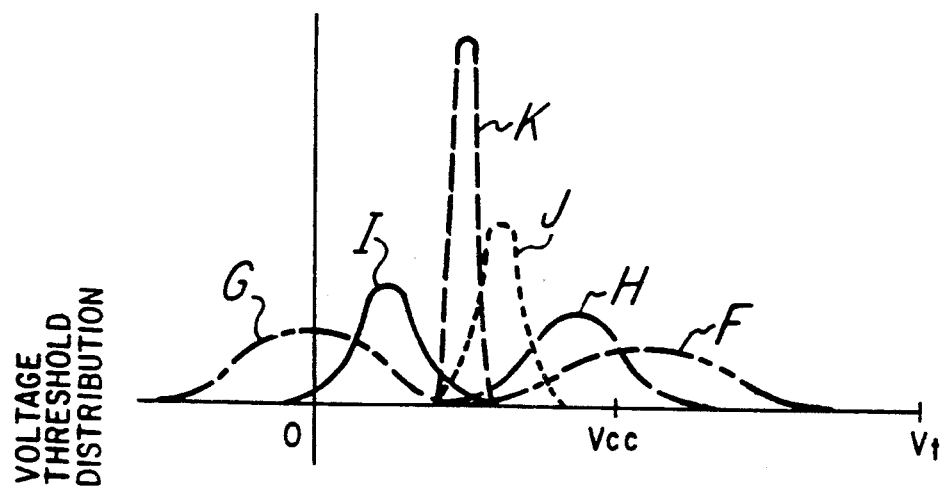
FIG. 2(c) illustrates example distributions of threshold voltages of an array of memory cells of this invention during the erase sequence of program/erase operations at decreasing energy levels.

In accordance with this invention the cells 10 are prepared for individual programming by subjecting the array to a sequence of flash-erase and flash-program cycles. Column decoder 18 and wordline decoder 16, in response to sequencing signals from erase control circuit 22 cause the cells 10 to be flash-programmed and flash-erased.. Erase control circuit 22, with voltage supplies including Vpp and Vee and decoders 16 and 18, causes pulsed electric fields adjacent a surface of each of the floating gates of the memory cells 10 of the EEPROM array, the electric fields directed alternately toward or away from a surface of each floating gate. Erase control circuit 22 initially causes alternating erasing and programming pulsed electric fields adjacent each floating gate to have relatively high energy-levels. The alternating erasing and programming pulsed electric fields are caused to have decreased energy-levels until each cell 10 has a threshold voltage Vt that is of the same polarity as the preselected wordline select, or read, voltage (perhaps Vcc) and which is less than that preselected read voltage. The sequenced pulses may be decreased in energy until no electrons are injected into or removed from the floating gates during application of alternating pulsed programming and erasing voltages/currents. Example distributions of the sequential threshold voltages Vt are shown in FIG. 2(c) as bell-shaped curves F, G, H, I, J and K; even though actual distributions will not necessarily have that shape.

As shown by the sequence of curves F-K of FIG. 1(c), the erased threshold voltage Vt distribution is compressed to a desired range by alternating flash-programming and flash-erasing operations. The erase control circuit 22 and decoder driving circuits of decoders 16 and 18 alternate in applying pulses between the wordlines 15 and at least one of the bitlines 17 or 19 of the array. For example, an initial flash-programming cycle may result in a threshold voltage Vt distribution among cells 10 such as that of Curve F. A subsequent flash-erasing cycle with less field energy adjacent the floating gate may then result in a distribution such as that of Curve G. The flash-erasing and flash-programming cycles continue with decreasing energy, compressing the voltage distribution with each operation as shown in the sequenced Curves H, I, J and K. The starting operation may have pulses with sufficient energy-level to cause over-erasure. The subsequent alternate-polarity field pulses may be decreased in energy-level in as many steps as necessary to achieve a reliably compact distribution. The extent of the compaction is, in general, a function of the change in energy level with each step, assuming a sufficient number of steps. The final threshold voltage Vt distribution may be positioned near a desired value of threshold voltage Vt, different from the threshold voltage Vt set during manufacture, by changing the initial energy-level of either the programming pulses or the erasing pulses, as further described below.

If the voltage pulses normally used to flash program a tunnel-window-type memory cell 10 array is 18 volts, for example, then the initial flash-erasing voltage might also be 18 volts, assuming that the pulse lengths of the programming and erasing pulses are the same. However, the threshold voltage Vt of the cells 10 will converge faster if the initial flash-erasing pulsed voltage is less than the initial flash-programming pulsed voltage. For example, if the flash-erasing and flash-programming voltages are each stepped down in one volt increments, the voltage between the wordlines and the source-column line may be pulsed in the following sequence for rapid convergence: +18.0, −17.5, +17.0, −16.5, +16... volts. In this example the average value of the electric fields adjacent the floating gate 13 surface will have an average value of substantially zero. The sequence may be continued until no charge is transferred across the tunnel oxide, at which point there is a minimum excess or deficiency of electrons on the floating gates 13 of the memory cells 10, and the threshold voltages Vt of the memory cells 10 are substantially equal to the initial threshold voltage Vts after manufactured, or the value after erasure by ultraviolet radiation.

If it is desired to change the erased threshold voltage Vt to a value different than that of the manufactured value, then the programming and erasing pulses may be offset from zero. The erased threshold voltage Vt values may be made greater than the initial threshold voltage Vts after manufacture by applying, for example, the following sequence of offset voltages to the wordlines and a source-column line: +19.0, −16.5, +18.0, −15.5, +17.0, . . . volts. In this example, the alternating programming and erasing electric fields have an average value in the programming direction. The erased threshold voltage Vt may be decreased to a value less than the initial threshold voltage Vts after manufacture by applying, for example, the following sequence of offset voltages: +17.0, −18.5, +16.0, −17.5, +15.0, −16.5 . . . volts. In this example, the alternating programming and erasing electric fields have an average value in the erasing direction.

The erased threshold voltage Vt values ay be increased of decreased from that of the manufactured value by ending the erase sequence prior to cease of charge transfer, but after the range of threshold voltages is compacted. Ending the sequence after an erasing step decreases the threshold voltages; ending the sequence after a programming step increase the threshold voltages.

While the examples above uses continuous one-volt steps between subsequent pulses of the same polarity, the size of the initial step and subsequent steps may be differ depending on cell 10 structure and other factors.

As is well-known, a voltage may be applied to the sources 11 or to the drains 12 prior to application of the programming or erasing pulses to the control gates 14. The value of voltage applied to the sources 11 or to the drains 12 may be varied to vary the strength of the programming or erasing pulses, and the voltage applied to the sources 11 or to the drains 12 may be used to provide an offset voltage between alternating programming and erasing pulses. As is also well-known, a fraction of the pulse energy applied between each control gate 14 of and each source 11 or drain 12 of cells 10 is coupled to the floating gates 13.

The relative energy levels of eh conditioning pulses, as compared to the levels of the programming pulses and/or prior-art erasing pulses, may be controlled by current-limiting circuitry, by electrical impulse-length-timing circuitry, or by other means of controlling energy-related product of voltage, current and time. Such circuitry is well-known in the art. For example, if the pulse lengths of the electrical programming and erasing pulse remain the same during the erasing sequence, the product of the voltage and current may be controlled to decrease the electrical pulse energies with each program/erase cycle. Similarly, if the voltage or current of the electrical programming and erasing pulses remain the same during the erasing sequence, the length of the electric energy pulses may be shortened to decrease the pulse energies with each program/erase cycle. In fact, the relative energy levels of the pulses may be decreased by controlling the product of pulse voltage, pulse current and pulse length to decrease the pulse energies with each flash-program/flash-erase cycle.

After the cells 10 have been erased according to this invention, individual cells 10 may be programmed. The threshold voltage Vt of the programmed cells 10 will again be distributed over a range such as that illustrated by curve B of FIG. 2(a).

While the examples shown in this description relate to cell 10 structures using Fowler-Nordheim tunnelling for programming, the concept is equally valid for cell 10 structures using channel-hot-electron or similar-type programming. In fact, the concept of this invention is applicable to all known nonvolatile memory arrays having floating-gate cells 10 that are programmable and erasable using electric field pulses.

Use of the circuit and procedure of this invention is straightforward. The type of cell structure and the charging/discharging structure for the floating gate must be chosen. The insulator, oxide or other type, to isolate the surfaces of the floating gate from other conducting surfaces must be chosen. If a tunnelling-type structure is used for charging and/or discharging the floating gate, then sufficient voltage must be applied across the tunnel to cause the oxide or other insulator to breakdown. The voltage across the tunnel may be a fraction of the voltage applied between the control electrode and the source/drain path. The fraction at the start of the pulse may be determined from capacitance ratios. The breakdown will occur at a point where the electric field strength is highest. The relationship between voltage applied to a control electrode and the highest electric field may sometimes be calculated or derived from a handbook, may sometimes be found in literature (e.g., textured oxide surfaces), and may sometimes be derived from test structures. If hot-carrier programming and/or erasing is used, similar procedures apply to design of the structure and circuitry. Whether using tunnelling, hot-carrier, or any other method, a test-cell structure may e formed on an integrated circuit chip prior to final design of programming and erasing circuitry, the cell structure tested on that chip using probes to determine the programming and erasing voltages necessary for operation, the circuitry then designed to provide those voltages for the manufactured memory array.

As is well-known, the programming and erasing pulses may be ramped to minimize damage to the floating gate insulation.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for erasing a memory cell having a floating gate, at least one control terminal, a source terminal and a drain terminal, said memory cell programmable and erasable by applying programming and erasing electrical energy pulses between said control terminal and at least one of said source and drain terminals, said memory cell readable by applying a preselected read voltage between said control terminal and at least one of said source and drain terminals, the method comprising:

initially applying first alternating said programming and erasing electric energy pulses between said control terminal and said at least one of said source and drain terminals;

then applying second alternating said programming and erasing electric energy pulses between said control terminal and said at least one of said source and drain terminals, said second alternating pulses having decreased energy-levels as compared to said first alternating pulses, until said cell has an erased threshold voltage having the same polarity as said preselected read voltage and that is less than said preselected read voltage.

2. The method of claim 1, wherein said programming electric energy pulses cause electric fields directed away from said floating gate, and wherein said erasing electric energy pulses cause electric fields directed toward said floating gate.

3. The method of claim 1, wherein said memory cell has an initial threshold voltage set during manufacture, wherein said laternating programming and erasing electric energy pulses have values such that said erased threshold voltage is greater than said initial threshold voltage set during manufacture.

4. The method of claim 1, wherein said memory cell has an initial threshold voltage set during manufacture, wherein said alternating programming and erasing electric energy pulses have values such that said erased threshold voltage is less than said initial threshold voltage set during manufacture.

5. The method of claim 1, wherein said memory cell has an initial threshold voltage set during manufacture, wherein said alternating programming and erasing electric energy pulses have values such that said erased threshold voltage is substantially equal to said initial threshold voltage set during manufacture.

6. The method of claim 1, wherein said control terminal is connected to a wordline, wherein said source terminal is connected to a source-column line, wherein said drain terminal is connected to a drain-column line, and wherein said energy-level of said electric energy pulses is caused by pulsed programming voltages and pulsed erasing voltages applied between said wordline and at least one of said source-column line and said drain-column line.

7. The method of claim 1, wherein said control terminal is connected to a wordline, wherein said source terminal is connected to a source-column line, wherein said drain terminal is connected to a drain-column line, wherein said energy-level of said electric energy pulses is caused by pulsed programming voltages and pulsed erasing voltages applied between said wordline and at least one of said source-column line and said drain-column line, wherein the voltage of a successive said pulsed programming voltage is less than that of the previous said pulsed programming voltage, and wherein the voltage of a successive said pulsed erasing voltage is less than that of the previous said pulsed erasing voltage.

8. The method of claim 1, wherein said control terminal is connected to a wordline, wherein said source terminal is connected to a source-column line, wherein said drain terminal is connected to a drain-column line, wherein said energy-level of said electric energy pulses is caused by pulsed programming currents and pulsed erasing currents applied between said wordline and at least one of said source-column line and said drain-column line.

9. The method of claim 1, wherein said control terminal is connected to a wordline, wherein said source terminal is connected to a source-column line, wherein said drain terminal is connected to a drain-column line, wherein said energy-level of said electric energy pulses is caused by pulsed programming currents and pulsed erasing currents applied between said wordline and at least one of said source-column line and said drain-column line, wherein the current of each successive said pulsed programming current is less than that of a previous said pulsed programming current, and wherein the current of each successive said pulsed erasing current is less than that of a previous said pulsed erasing current.

10. The method of claim 1, wherein said control terminal is connected to a wordline, wherein said source terminal is connected to a source-column line, wherein said drain terminal is connected to a drain-column line, wherein said energy-level of said electric energy pulses is related to the length of electrical programming and erasing pulses applied between said wordline and at least one of said source-column like sand said drain-column line.

11. The method of claim 1, wherein said control terminal is connected to a wordline, wherein said source terminal is connected to a source-column line, wherein said drain terminal is connected to a drain-column line, wherein said energy-level of said electric energy pulses is related to the length of electric programming and erasing pulses applied between said wordline and at least one of said source-column line and said drain-column line, wherein the length of each successive said electric programming pulse is less than that of a previous said electric programming pulse, and wherein the length of each successive said electric erasing pulse is less than that of a previous said electric erasing pulse.

12. A non-volatile memory array, comprising:
memory cells arranged in rows and columns, each said memory cell having a source-drain path between first and second terminals and having a control-gate terminal
a source-column line connected to each said first terminal of each said memory cell in a said column;
a drain-column line connected to each said second terminal of each said memory cell in a said column;
a wordline connected to each said control-gate terminal of each said memory cell in a said row;
each said memory cell having a floating-gate conductor insulated from said source-drain path and from said control gate terminal, said floating-gate conductor being programmable and erasable by programming and erasing pulsed electric fields adjacent said floating-gate conductor, said programming and erasing pulsed electric fields related to pulsed programming and erasing voltages applied between said control-gate terminal and at least one of said first and second terminals;
a column decoder connected to said source-column lines and said drain column lines and a wordline decoder connected to said wordlines for providing said pulsed programming and erasing voltages to said memory cells via said wordlines and at least one of said source-column lines and said drain-column lines; and
an erase control circuit for causing said column decoder and said wordline decoder to provide said pulsed programming and erasing voltages to said memory cells via said wordlines and at least one of said source-column lines and said drain-column lines, said control circuit initially causing relatively high-energy-level programming and erasing pulsed electric fields directed alternately toward or away from a surface of said floating gates; said control circuit then causing said alternating programming and erasing pulsed electric fields to have decreased energy-levels.

13. The array of claim 12, wherein said energy-level of said programming and erasing pulsed electric fields is controlled by varying voltages applied to said wordlines and at least one of said source-column lines and said drain-column lines.

14. The array of claim 12, wherein said energy-level of said programming and erasing pulsed electric fields is controlled by varying currents applied to said wordlines and at least one of said source-column lines and said drain-column lines.

15. The array of claim 12, wherein said energy-level of said programming and erasing pulsed electric fields is controlled by varying the length of electrical pulses applied to said wordlines and at least one of said source-column lines and said drain-column lines.

16. A method for erasing a memory-cell array prior to programming said array, each said memory cell including a floating gate, the method comprising:
    initially causing alternating erasing and programming pulsed electric fields adjacent said floating gates of said memory cell array, said pulsed electric fields initially having relatively high energy-level;
    then causing said alternating erasing and programming pulsed electric fields to have decreased energy-level until each said memory cell is erased but not over-erased.

17. The method of claim 16, wherein said array includes a plurality of wordlines, source-column lines and drain-column lines; wherein each said memory cell has a terminal connected to a said wordline, has a terminal connected to a said source-column line, and has a terminal connected to a said drain-column line; wherein pulsed programming and erasing voltages are applied between said wordlines of said memory array and at least one of said source-column lines and said drain-column lines of said memory array; and wherein said energy-level of said pulsed electric fields is caused by pulsed said programming and erasing voltages.

18. The method of claim 16, wherein said array includes a plurality of wordlines, source-column lines and drain-column lines; wherein each said memory cell has a terminal connected to a said wordline, has a terminal connected to a said source-column line, and has a terminal connected to a said drain-column line; wherein pulsed programming and erasing currents are applied between said wordlines of said memory array and at least one of said source-column lines and said drain-column lines of said memory array; and wherein said energy-level of said pulsed electric fields is caused by said pulsed programming and erasing currents.

19. The method of claim 16, wherein said array includes a plurality of wordlines, source-column lines and drain-column lines; wherein each said memory cell has a terminal connected to a said wordline, has a terminal connected to a said source-column line, and has a terminal connected to a said drain-column line; wherein programming and erasing electric pulses are applied between said wordlines of said memory array and at least one of said source-column lines and said drain-column lines of said memory array; and wherein said energy-level of said pulsed electric fields is related to the length of said programming and erasing electric pulses.

20. The method of claim 16, wherein said erasing pulsed electric fields are directed toward said floating gates and wherein said programming pulsed electric fields are directed away from said floating gates.

* * * * *